United States Patent [19]

Dow

[11] Patent Number: 5,306,967
[45] Date of Patent: Apr. 26, 1994

[54] APPARATUS FOR IMPROVING SIGNAL TRANSMISSION ALONG PARALLEL LINES

[75] Inventor: Keith E. Dow, Mountain View, Calif.

[73] Assignee: Integrated Device Technology, Inc., Santa Clara, Calif.

[21] Appl. No.: 891,233

[22] Filed: May 29, 1992

[51] Int. Cl.[5] .............................................. H01L 25/00
[52] U.S. Cl. .................... 307/482.1; 307/443
[58] Field of Search .............. 307/482.1, 443, 475, 307/242; 370/6; 333/1, 12

[56] References Cited

U.S. PATENT DOCUMENTS 4,404,663  9/1983  Saeki et al. .................... 307/443
4,916,331  4/1990  Peitz, Jr. ........................ 307/242

OTHER PUBLICATIONS

H. B. Bakoglu, *Circuits, Interconnections, and Packaging for VLSI*, Addison-Wesley Publishing Company, pp. ix–xiv, 202–219, 502–505, and title page (1990).

Primary Examiner—Edward P. Westin
Assistant Examiner—Jon Santamauro
Attorney, Agent, or Firm—Limbach & Limbach

[57] ABSTRACT

An apparatus for reducing signal degradation, propagation delay, and electromagnetic emission problems inherent in transmission of electrical signals along interconnect lines (such as lines which connect transistors in integrated circuits). The apparatus includes one or more pairs of generally parallel interconnect lines. Each line in each pair comprises line sections, and an inverter is connected between each pair of adjacent sections of each line. The inverters are arranged in staggered fashion, in the sense that the inverters connected along each line of a line pair are offset longitudinally from the inverters connected along the other line of the pair. Both bidirectional and unidirectional buses (groups of generally parallel interconnect line pairs) can be implemented in accordance with the invention. The invention can serve as the basis for increasing the speed of computers and other electrical devices, and permits tight packing of transistors and interconnect lines with minimal crosstalk between the lines.

12 Claims, 3 Drawing Sheets

APPARATUS FOR IMPROVING SIGNAL TRANSMISSION ALONG PARALLEL LINES

TECHNICAL FIELD

The invention pertains to apparatus for transmitting electrical signals along parallel lines. More particularly, the invention pertains to apparatus for transmitting electrical signals along parallel lines between circuit elements, such as transistors, of integrated circuits, printed circuit boards, or multichip modules, with reduced propagation delay, loss, and electromagnetic radiation emission.

BACKGROUND OF THE INVENTION

Modern computers and other electrical devices use integrated circuits composed of transistors, other components, and interconnections. In the past, one of the principal limitations on the computational speed of computers, and the operational speed of other devices, was the rate at which their component transistors could switch between logic states. As the switching speed of transistors has improved, the overall speed of computers and other devices has become limited by other factors.

One of these limiting factors is the speed with which signals are transmitted between the individual transistors which comprise an integrated circuit. During transmission of signals along parallel lines between transistors and other elements, the signal strength, propagation time, and propagation environment are affected by a variety of physical mechanisms. The present invention reduces or eliminates the effects of certain of these mechanisms, thereby improving the speed and other operating characteristics of devices in which signals are transmitted along parallel lines.

The strength of a signal transmitted along a line degrades due to resistance losses along the propagation path. In addition, the signal propagation time between two elements connected by a line depends on the resistance and capacitance of the line (the delay depends on the resistance-capacitance product, or "RC" product, of the interconnect line).

A further problem is that a signal propagating along a first line induces electromagnetic fields in adjacent parallel lines due to electromagnetic coupling. This "crosstalk" between the lines increases the noise and reduces the signal-to-noise ratio of the signal transmitted through the first line. Crosstalk interferes with the intended signal transmission and degrades the operational characteristics of the device.

Another problem that may affect the marketability of a product is that certification from the Federal Communications Commission (FCC), which is often a prerequisite for sale of a product, is dependent on the level of ambient electromagnetic radiation produced by its wires and components. Therefore it is important in designing a device to reduce the level of emissions generated by the device. Since wires carrying a time varying current produce electromagnetic radiation, the structure of transistor interconnection lines can affect the level of emissions, and hence the likelihood that a device will receive FCC certification.

Another problem with transmission of voltage signals between voltage inverters along parallel lines is that even mode propagation of the signals (which occurs when the signals propagating along corresponding segments of the lines undergo simultaneous transitions from higher to lower or lower to higher voltage states), results in faster propagation than odd mode propagation of the signals (which occurs when each transition of a bilevel signal in one line from a first voltage state to second voltage state occurs at the same time that the signal propagating along a corresponding segment of a parallel line undergoes a transition from the second state to the first state). This asymmetry in propagation time (between odd and even mode propagation) can affect the operation of a device which relies on synchronous switching of components between states, because the triggering signals for the switching may not propagate along two interconnect lines in the same amount of time, depending on the operating mode of the device. This affects the development and utility of integrated circuits since it means that the possibility of both even and odd mode propagation must be taken into account when the circuit is designed.

The problems noted above affect the operational performance of computers and other electrical devices, and can determine whether the device's characteristics make it desirable to the user. Several conventional approaches have been used in attempts to overcome some of the problems (but not all of them at one time), to transmit signals efficiently between separated circuit elements of a printed circuit board or integrated circuit.

One conventional method is to use a driver circuit which overcomes the inherent losses along a line by amplifying the signal before it is sent through a line (for example, a line connecting two transistors). This addresses signal degradation problems, but does not resolve the other abovementioned problems. Indeed, use of a driver can increase (rather than decrease) electromagnetic emissions, and does not address the problem of propagation time dependence on even or odd propagation mode.

Because both the resistance (R) and capacitance (C) of an interconnect line increases linearly with line length, the propagation delay (proportional to the product RC) is proportional to the square of the line length. Another conventional method exploits this phenomenon by breaking an interconnect line into multiple (shorter) line sections, and connecting a repeater circuit (such as an inverter) between each pair of adjacent line sections, so that a voltage signal will propagate from repeater to repeater down the line.

Connection of repeaters in this manner breaks the line into smaller sections whose delay times add together arithmetically to give the total line delay. This results in a total delay time for the line which is proportional to its length instead of the square of its length. Use of repeaters is described in Bakoglu, *Circuits, Interconnections, and Packaging for VLSI*, Addison-Wesley Publishing Co., 1990, which also discusses alternative conventional approaches to reducing distributed RC delays along interconnect lines.

However, even if repeaters are employed to break a line into segments, some of the above-described problems remain. While signal degradation is lessened, propagation delay is improved, and crosstalk is reduced under certain conditions, conventional use of repeaters does not significantly reduce electromagnetic emissions or address the propagation time asymmetry problem, and crosstalk can still be a problem. In addition, conventional use of repeaters can affect the ultimate size of a device since they increase the amount of packing room necessary for each interconnect line.

Another conventional method that has been used to address the RC delay problem is to reduce interconnection resistance by using aluminum lines in conjunction with a hierarchy of interconnect levels on an integrated circuit. Aluminum is a desirable material for forming interconnect lines because of its low resistance. The shorter, local interconnections on the same level of the circuit can be of one cross-sectional shape of aluminum, and those between different levels of the circuit can utilize aluminum whose cross-section has been optimized (by making it wider and thicker) to reduce the RC product for the lines. This approach solves some of the above-mentioned problems, at least on a global level, but increases the complexity of the design task and fails to address some of the problems.

The present invention significantly reduces or eliminates all of the above-mentioned problems, enabling signals to be transmitted along pairs of generally parallel lines (e.g., between transistors) faster and more efficiently, with minimal effect on the packing requirements for devices which embody the invention. This results in enhanced performance for devices which incorporate multiple, connected transistors. It is an object of the present invention to provide a means for solving the problems inherent in the use of long interconnect lines without the drawbacks and limitations of conventional use of drivers or repeaters.

SUMMARY OF THE INVENTION

The invention is an apparatus for reducing signal degradation, propagation delay, and electromagnetic emission problems inherent in transmission of electrical signals along long interconnect lines (such as lines which connect transistors in integrated circuits). The inventive apparatus includes one or more pairs of generally parallel interconnect lines. Each line in each pair is broken into line sections, and an inverter is connected between each pair of adjacent sections of each line. The inverters are arranged in "staggered" fashion, in the sense that the inverters connected along each line of a line pair are offset longitudinally from the inverters connected along the other line of the pair.

Both bidirectional and unidirectional buses (or groups of generally parallel interconnect line pairs) can be implemented in accordance with the invention. The invention reduces or eliminates the problems presently encountered in using long interconnect lines, and can serve as the basis for increasing the speed of computers and other electrical devices. The invention allows tight packing of transistors and interconnect lines with minimal crosstalk between lines.

DETAILED DESCRIPTION OF THE PREFERRED EMBODIMENT

Figure 1:
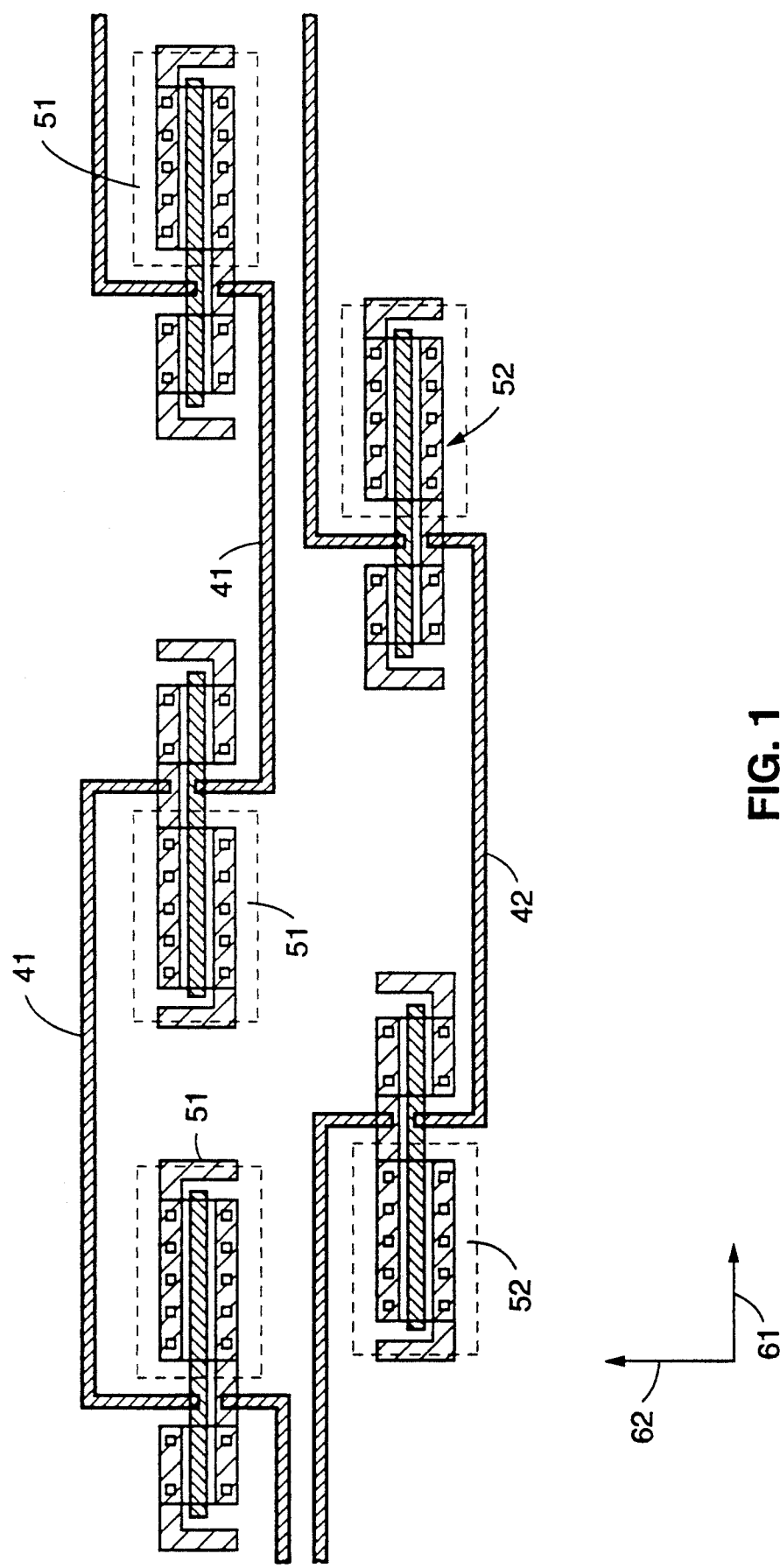
FIG. 1 is a cross-sectional view of a portion of an integrated circuit embodying the invention, and including two generally parallel interconnect lines and inverters connected in staggered fashion along the interconnect lines.

FIG. 1 shows a portion of an integrated circuit including generally parallel electrically conductive lines 41 and 42. Electrical signals propagate unidirectionally along sections of line 41 (in the direction of arrow 61) between identical inverter circuits 51. Similarly, electrical signals propagate unidirectionally along sections of line 42 (in the direction of arrow 61) between identical inverter circuits 52. In accordance with the invention, the inverters are arranged in "staggered" fashion, in the sense that each of the inverters 51 connected along line 41 is offset longitudinal (i.e., in the direction of signal propagation) from all the inverters 52 connected along line 42 without longitudinal overlap, except that inverter 51 at the left side of FIG. 1 is not arranged in staggered fashion because it is not offset longitudinally (without longitudinal overlap) from all the inverters 52.

Each of inverters 51 and 52 inverts the logic state of the signal it receives. For example, if the middle inverter 51 receives a voltage signal having a "high" voltage value (+V volts), it will transmit a voltage signal having a "low" voltage value (e g., zero volts) to the next inverter 51 along line 41).

In general, a circuit embodying the invention will include a set of generally parallel interconnect lines, and inverters connected along the lines in "staggered" fashion, in the sense that the inverters connected along a first line are offset longitudinally (in the direction of signal propagation, i.e., direction 61 in FIG. 1) from the inverters connected along the line or lines nearest to the first line (i.e., the line or lines separated from the first line by the smallest distance in a direction perpendicular to the direction of signal propagation (i.e., direction 62 in FIG. 1).

Figure 2:
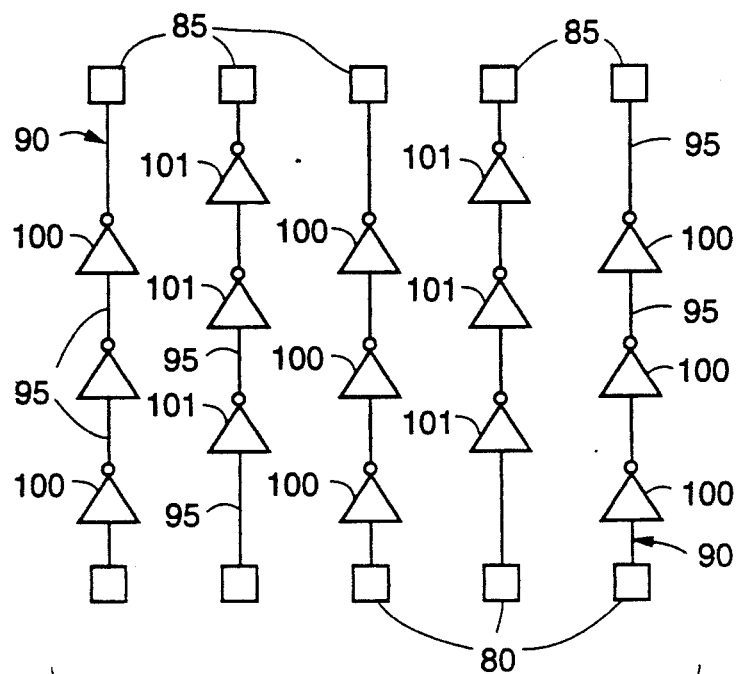
FIG. 2 is a schematic diagram of a first embodiment of the invention, which includes a set of parallel, unidirectional interconnection lines, and inverter circuits connected in staggered fashion along the lines.

FIG. 2 is a schematic diagram of a first embodiment of the invention, in which a set of five circuit elements 80 are connected to a set of five circuits elements 85 by a set of five interconnect lines 90. The FIG. 2 apparatus is a bus for transmitting signals from circuit elements 80 to circuits elements 85. Each interconnect line 90 consists of multiple line sections 95. An inverter circuit (100 or 101) is connected between each pair of adjacent line sections 95. Each of the first, third, and fifth line 90 has inverters 100 connected along it, and each of the second and fourth lines 90 has inverters 101 connected along it. As shown in FIG. 2, each set of inverters 100 is connected in staggered fashion with respect to the set of inverters 101 nearest thereto.

Figure 3:
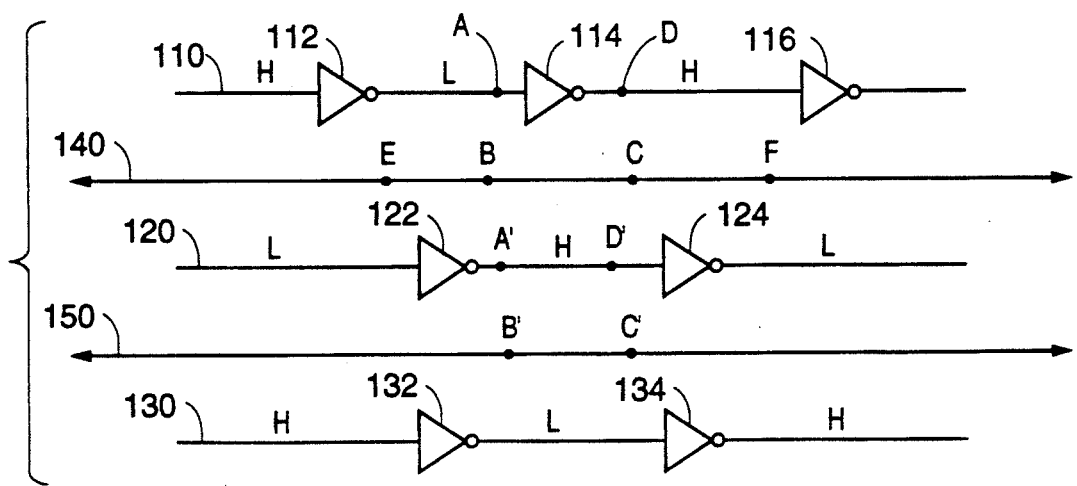
FIG. 3 is a schematic diagram of a circuit embodying the invention, including inverters connected in staggered fashion along first and second interconnect lines, and a third interconnect line having inverters connected in alignment with the inverters of the second line.

The manner in which the staggered arrangement of inverters reduces crosstalk between two generally parallel interconnect lines (lines 110 and 120), and electromagnetic radiation from the lines, will be described with reference to FIG. 3. In FIG. 3, inverters 112, 114, and 116 are connected along line 110, inverters 122 and 124 are connected along line 120 (in staggered fashion relative to inverters 112, 114, and 116), and inverters 132 and 134 are connected along line 130 in alignment with inverters 122 and 124 (i.e., inverters 132 and 134 are not connected in staggered fashion relative to inverters 122 and 124). Axis 140 is located in the region between lines 110 and 120, and axis 150 is located in the region between lines 120 and 130.

Because current flows in opposite directions between consecutive inverters along each of lines 110 and 120, electromagnetic radiation from each of these lines will be substantially less than if the inverters were omitted.

In the following discussion, we assume that a voltage signal having a high voltage value ("H") is asserted to each of inverters 112 and 132, and a low voltage signal (having voltage "L") is asserted to inverter 122. Thus, a low voltage signal (having voltage "L") propagates from inverter 112 to inverter 114, and from inverter 132 to inverter 134, a high voltage signal (having voltage "H") propagates from inverter 114 to inverter 116, from inverter 122 to inverter 124, and from inverter 134 toward the right along line 130, and a low voltage signal (having voltage "L") propagates from inverter 124 toward the right along line 120.

Thus, there can be substantial current flow from line 120 to line 130 (at points B' and C' along axis 150). Such current flow is responsible for producing undesirable electromagnetic radiation, interference, and loss during signal transmission along lines 120 and 130. Also, if a high voltage value ("H") were asserted simultaneously to each of inverters 122 and 132, to cause low voltage signals to propagate simultaneously from inverter 122 to inverter 124 and from inverter 132 to inverter 134, current flow from inverter 122 to 124 would be in the same direction as current flow from inverter 132 to 134, which could result in substantial induced current flow between lines 120 and 130 that could substantially affect signal transmission along lines 120 and 130.

However, staggered arrangement of inverters on lines 110 and 120 (in accordance with the invention) substantially reduces these problems associated with signal transmission along lines 120 and 130. The reason for this can be understood by appreciating that although substantial current flow may between lines 120 and 130 at point B along axis 140 between lines 120 and 130), no significant current could flow at the same time between lines 120 and 130 at point C along axis 140. Also, when current flows from inverter 116 to 114, current will flow from inverter 112 to inverter 114 (so that current will flow in opposite directions at points A and D along line 110), while current will flow in the same direction at both points A' and D' along line 120. Thus, current flow induced in line 120 by line 110 (at point A') will effectively cancel current flow induced in line 120 by line 110 (at point D'), resulting in substantially reduced (or eliminated) average crosstalk between lines 110 and 120.

The staggered arrangement of inverters along lines in accordance with the invention also reduces asymmetry in propagation times (between odd and even mode propagation) which results in prior art circuits. This can be understood by considering the case that in FIG. 3, if a high voltage value ("H") is asserted to inverter 112 and a low voltage signal ("L") is asserted to inverter 122, there will be even mode propagation between the locations of inverters 112 and 122 along axis 140 (i.e., at point E on axis 140), but odd mode propagation between the locations of inverters 122 and 114 along axis 140 (i.e., at point B on axis 140). Similarly, there will be even mode propagation between the locations of inverters 114 and 124 along axis 140 (i.e., at point C on axis 140), but odd mode propagation between the locations of inverters 124 and 116 along axis 140 (i.e., at point F on axis 140). Thus, there will effectively be an averaged or balanced propagation mode (i.e., an average between even and odd propagation modes) along each segment of axis 140. Because the propagation modes of interconnect line pairs which utilize the present invention are effectively a combination of even and odd modes, the net effect is to average out the propagation times between those that would result from pure even and odd mode propagation.

Figure 4:
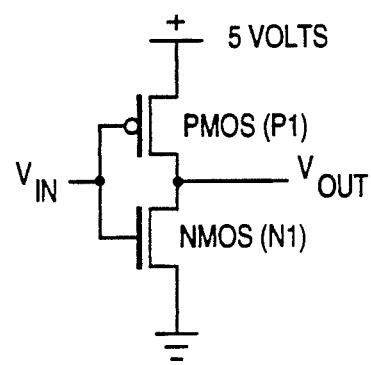
FIG. 4 is a schematic diagram of an inverter circuit suitable for use in a unidirectional bus embodying the invention.

FIG. 4 is a schematic diagram of an inverter circuit suitable for use as any of inverters 51, 52, 100, 101, 112, 114, 116, 122, or 124 in the above-described embodiments of the invention. In FIG. 4, when input voltage $V_{in}$ is "high," PMOS transistor P1 turns off, and NMOS transistor N1 turns on, pulling output voltage $V_{out}$ low (i.e., to ground). When input voltage $V_{in}$ is "low," NMOS transistor N1 turns off, and PMOS transistor P1 turns on, pulling output voltage $V_{out}$ high (i.e., to 5 volts).

Figure 5:
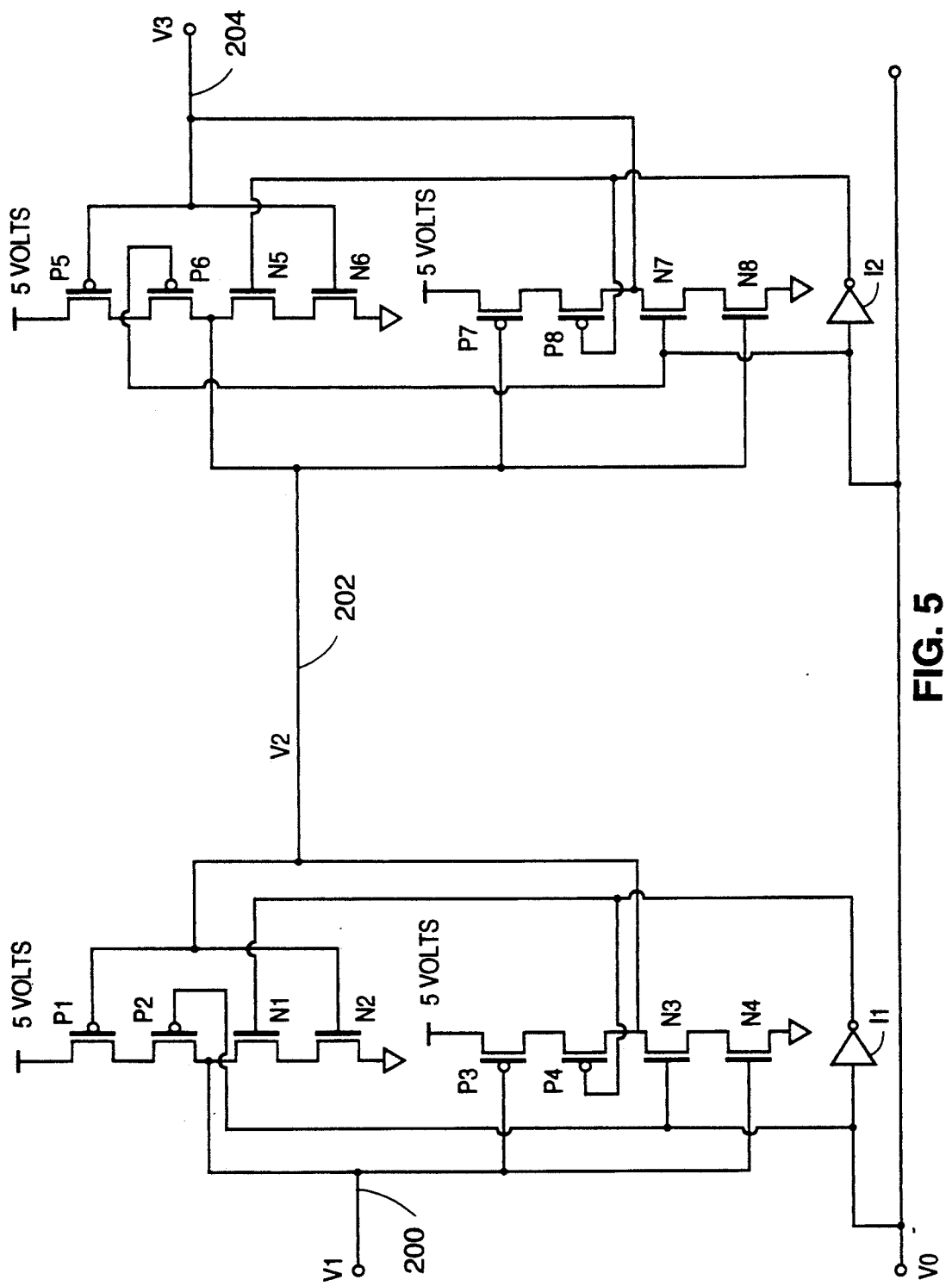
FIG. 5 is a schematic diagram of two identical inverter circuits suitable for use in a bidirectional bus embodying the invention.

We next describe (with reference to FIG. 5) a bidirectional inverter suitable for substitution for inverters 51 and 52 in FIG. 1, or inverters 100 and 101 in FIG. 2, or inverters 122, 114, 116, 122, and 124 in FIG. 3, to facilitate bidirectional signal transmission along the interconnect lines on which the FIG. 5 inverters are connected.

FIG. 5 shows two identical bidirectional inverters: one connected between interconnect line sections 200 and 202; the other connected between interconnect line sections 202 and 204. The first inverter includes PMOS transistors P1, P2, P3, and P4, and NMOS transistors N1, N2, N3, and N4. The second inverter includes PMOS transistors P5, P6, P7, and P8, and NMOS transistors N5, N6, N7, and N8. The gates of transistors P2, N3, P6, and N7 receive switching voltage V0, and the gates of transistors N1, P4, N5, and P8 receive the inverse of switching voltage V0 (which inverse switching voltaqe is asserted at the output of both inverter I1 and inverter I2).

In a mode in which a voltage signal is to be transmitted from line section 200 to line section 204, switching voltage V0 is set "high." As a result, transistors N3, P4, P8, and N7 will turn on, transistors N1, P2, N5, and P6 will turn off, voltage V2 (on line section 202) will be the inverse of voltage V1 (on line section 200), and voltage V3 (on line section 204) will be the inverse of voltage V2 (on line section 202). In response to a transition in voltage V1 from high to low (i.e., from +5 volts to ground), voltage V2 will undergo a transition from low to high (from ground to +5 volts), and voltage V3 will undergo a transition from high to low (from +5 volts to ground). Specifically, when voltage V1 undergoes a transition from low (ground) to high (+5 volts), PMOS transistor P3 turns off, and NMOS transistor N4 turns on, pulling output voltage V2 low (i.e., to ground). Then, in response to voltage V2's transition to a low state, NMOS transistor N8 turns off, and PMOS transistor P7 turns on, pulling output voltage V3 high (i.e., to +5 volts). Similarly, when voltage $v_1$ undergoes a transition from high to low, NMOS transistor N4 turns off, and PMOS transistor P3 turns on, pulling output voltage V2 high (i.e., to +5 volts). Then, in response to voltage V2's transition to a high state, PMOS transistor P7 turns off, and NMOS transistor N8 turns on, pulling output voltage V3 low (to ground voltage).

In the opposite mode in which a voltage signal is to be transmitted from line section 204 to line section 200, switching voltage V0 is set "low." As a result, transistors N3, P4, P8, and N7 will turn off, transistors N1, P2, N5, and P6 will turn on, voltage V2 (on line section 202)

will be the inverse of voltage V3 (on line section 204), and voltage V1 (on line section 200) will be the inverse of voltage V2 (on line section 202). In response to a transition in voltage V3 from high to low (i.e., from +5 volts to ground), voltage V2 will undergo a transition from low to high (from ground to +5 volts), and voltage V1 will undergo a transition from high to low (from +5 volts to ground).

The well-known SPICE circuit simulation computer program was used to simulate bus wires of the conventional Model "3051" microprocessor available from Integrated Device Technology, Inc., of Santa Clara, Calif. The result of the simulation was that signals propagated 23% faster down pairs of the bus wires having inverter circuits connected along them in staggered fashion, than in the case In embodiments of the invention in which the interconnect lines and inverters are embodied (with other circuit components) in a single integrated circuit, all the inverters should have the same channel width. In each integrated circuit implementation of the inverter circuit of FIG. 4 or 5, the N-channel will typically have half the width of the P-channel. One of ordinary skill in the art of integrated circuit design will be able readily to select an optimum combination of: the number of identical inverters to be connected along each interconnect line of the inventive apparatus; and the width of each inverter's N-channel (to minimize signal propagation time along the line).

Various other modifications and variations of the described apparatus of the invention will be apparent to those skilled in the art without departing from the scope of the invention. Although the invention has been described in connection with specific preferred embodiments, it should be understood that the invention as claimed should not be unduly limited to such specific embodiments.

What is claimed:

1. An apparatus for transmitting electrical signals, including:
   a first interconnect line comprising at least two line sections;
   a second interconnect line comprising at least two line sections, and oriented substantially parallel to the first interconnect line;
   a first set of inverters connected along the first interconnect line, and including an inverter connected between each pair of adjacent line sections of the first interconnect line; and
   a second set of inverters connected along the second interconnect line, and including an inverter connected between each pair of adjacent line sections of the second interconnect line, wherein the second set of inverters is connected in staggered fashion relative to the first set of inverters, with no overlap between each of the inverters in the second set and the inverters in the first set along an axis substantially parallel to the first interconnect line.

2. The apparatus of claim 1, wherein the inverters in the first set and the second set are substantially identical, and the line sections of the first interconnect line and the second interconnect line have substantially equal length.

3. The apparatus of claim 1, wherein the inverters in the first set and the second set are unidirectional inverters, and wherein the electrical signals propagate unidirectionally along the first interconnect line and the second interconnect line.

4. The apparatus of claim 3, wherein the unidirectional inverters are CMOS inverters, each comprising a PMOS transistor and an NMOS transistor having gates connected in common, and wherein the unidirectionally propagating electrical signals are received at said gates.

5. The apparatus of claim 1, wherein the inverters in the first set and the second set are bidirectional inverters, and wherein the electrical signals propagate bidirectionally along the first interconnect line and the second interconnect line.

6. The apparatus of claim 5, wherein each of the bidirectional inverters includes a first inverter circuit for inverting electrical signals propagating in a first direction, a second inverter circuit for inverting electrical signals propagating in a second direction opposite to the first direction, and switching means for selectively activating one of the first inverter circuit and the second inverter circuit.

7. The apparatus of claim 1, also including:
   a third interconnect line comprising at least two line sections, and oriented substantially parallel to the first interconnect line;
   a third set of inverters connected along the third interconnect line, and including an inverter connected between each pair of adjacent line sections of the third interconnect line, wherein the third set of inverters is connected in staggered fashion relative to the second set of inverters, with no overlap between each of the inverters in the third set and the inverters in the second set along the axis substantially parallel to the first interconnect line.

8. The apparatus of claim 7, wherein the inverters in the first set, the second set and the third set are substantially identical, and the line sections of the first interconnect line, the second interconnect line, and the third interconnect line have substantially equal length.

9. A bus for transmitting electrical signals, including:
   a set of substantially parallel interconnect lines, each comprising at least two line sections; and
   inverters connected along each of the interconnect lines, including an inverter connected between each pair of adjacent line sections of each of the interconnect lines, wherein the inverters connected along a first one of the lines are connected in staggered fashion relative to the inverters connected along each of the lines nearest to said first one of the lines, with no overlap between each of the inverters connected along said first one of the lines and the inverters connected along said each of the lines nearest to said first one of the lines, along an axis substantially parallel to said first one of the lines.

10. The bus of claim 9, wherein the inverters are substantially identical, and the line sections all have substantially equal length.

11. The bus of claim 9, wherein the inverters are unidirectional inverters, and wherein the electrical signals propagate unidirectionally along the interconnect lines.

12. The bus of claim 9, wherein the inverters are bidirectional inverters, and wherein the electrical signals propagate bidirectionally along the interconnect lines.

* * * * *